(12) United States Patent  (10) Patent No.: US 9,257,637 B2
Guo  (45) Date of Patent: Feb. 9, 2016

(54) METHOD OF MANUFACTURING MRAM MEMORY ELEMENTS

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 10 days.

(21) Appl. No.: 14/170,645

(22) Filed: Feb. 3, 2014

(65) Prior Publication Data

US 2014/0217527 A1   Aug. 7, 2014

Related U.S. Application Data

(60) Provisional application No. 61/760,154, filed on Feb. 3, 2013.

(51) Int. Cl.
*H01L 43/12* (2006.01)
*H01L 43/02* (2006.01)

(52) U.S. Cl.
CPC ............... *H01L 43/12* (2013.01); *H01L 43/02* (2013.01)

(58) Field of Classification Search
CPC .............................. H01L 43/12; H01L 43/02
USPC ............................... 438/3; 257/421; 365/158
See application file for complete search history.

(56) References Cited

U.S. PATENT DOCUMENTS

2014/0170776 A1 *   6/2014   Satoh et al. ................ 438/3

* cited by examiner

*Primary Examiner* — Evan Pert
*Assistant Examiner* — Changhyun Yi
(74) *Attorney, Agent, or Firm* — 5Suns; Yuanhui Huang

(57) ABSTRACT

A STT-MRAM comprises a method to form magnetic random access memory (MRAM) element array having ultra small dimensions using double photo exposures and etch of their hard masks. The memory cells are located at the cross section of two ultra-narrow photo-resist lines suspended between two large photo-resist bases. Array of MRAM cells with small dimension is formed by a third magnetic etch.

19 Claims, 6 Drawing Sheets

Present Invention

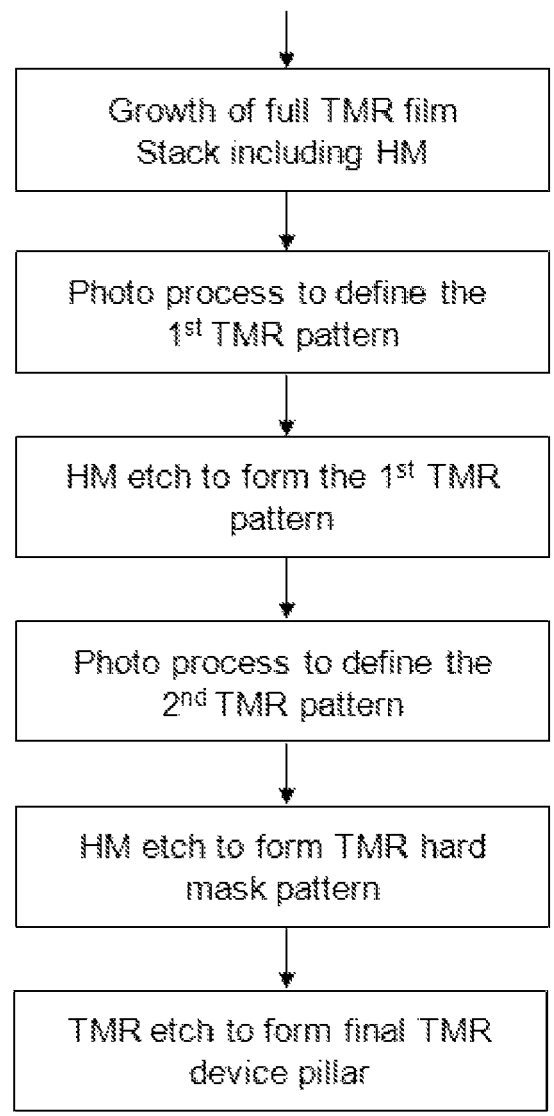
Figure 1. Present Invention

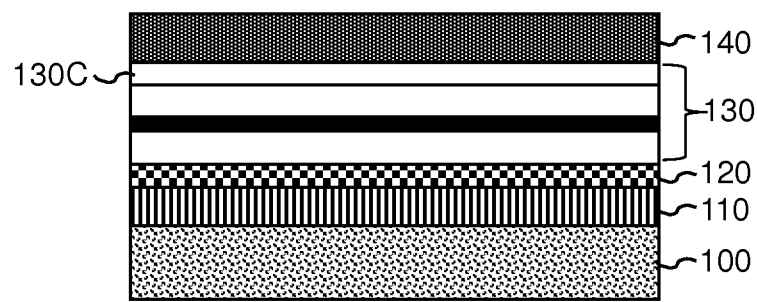
Figure2. Present Invention

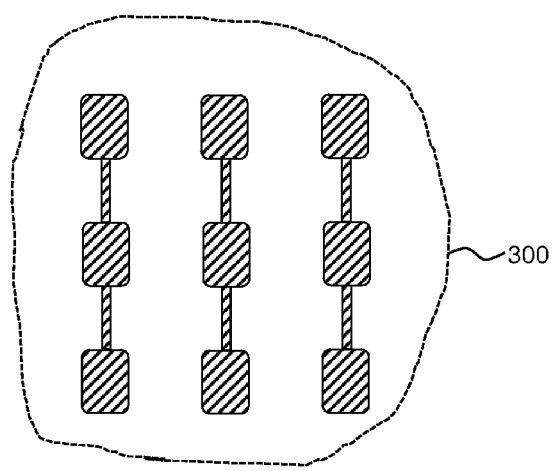 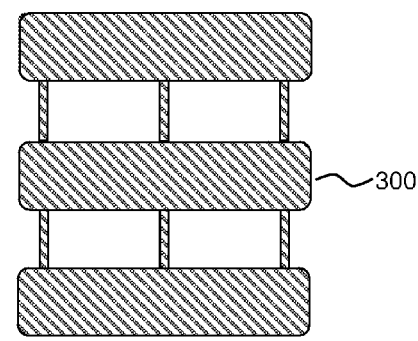
Figure3(a). Present Invention        Figure3(b). Present Invention

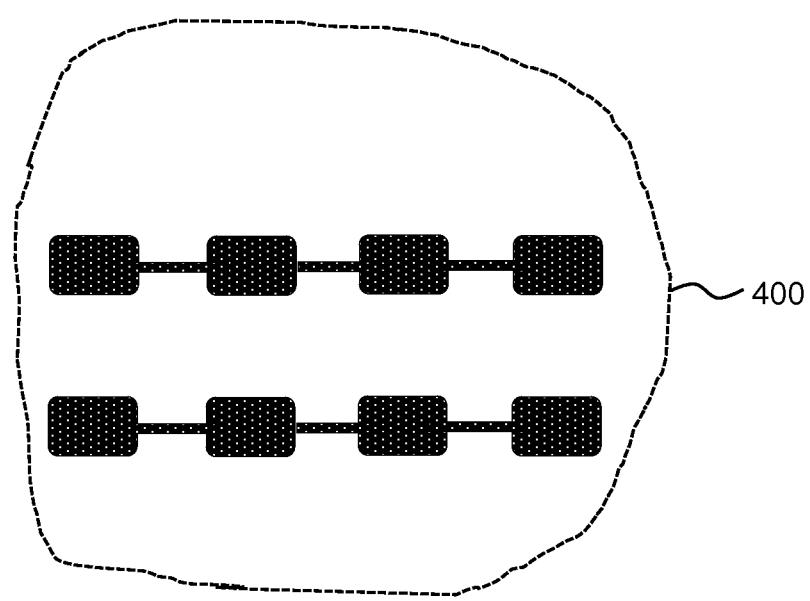
Figure 4. Present Invention

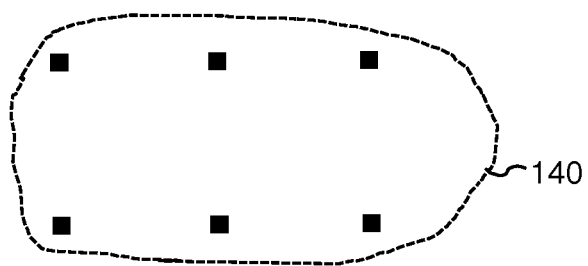
Figure 5(a). Present Invention
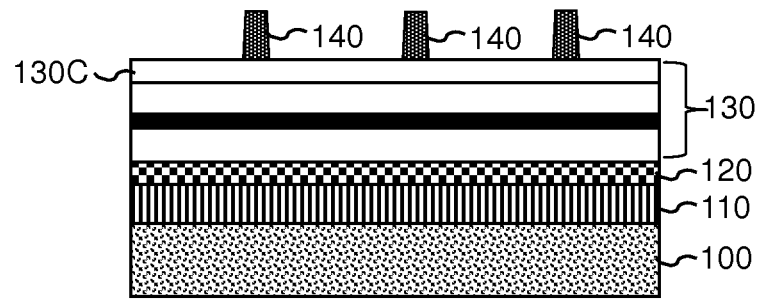
Figure 5(b). Present Invention

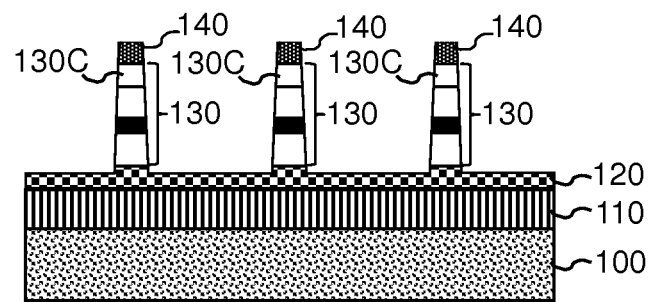
Figure 6. Present Invention

METHOD OF MANUFACTURING MRAM MEMORY ELEMENTS

RELATED APPLICATIONS

This application claims the priority benefit of U.S. Provisional Application No. 61/760,154, filed Feb. 3, 2013, which is incorporated herein by reference.

BACKGROUND OF THE INVENTION

1. Field of the Invention

This invention relates generally to a method of manufacturing spin transfer magnetic-random-access memory (MRAM) having magnetoresistive elements as basic memory cells, more particularly to a method of fabricating magnetoresistive elements having ultra small dimensions by dual photo exposures and etching of hard masks.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed layer that is located on the opposite side from the recording layer and maintains a predetermined magnetization direction.

There has been a known technique for achieving a high MR ratio in a magnetoresistive element by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

In the mean time, since the switching current requirements reduce with decreasing MTJ element dimensions, STT-MRAM has the potential to scale nicely at the most advanced technology nodes. However, patterning of small MTJ element may lead to increasing variability in MTJ resistance and sustaining relatively high switching current or recording voltage variation in a STT-MRAM; accordingly a degradation of MRAM performance would occur. Due to the limitation (such as UV light source and photo-resist thickness) of the current photolithography technology, it is also difficult to form ultra-small photo-resist pillar pattern. Once a cell dimension is getting too small, the photo-resist pillars will not be strong enough to support themselves and bend or tilt; accordingly causing a variation in magnetoresistive element dimensions. More seriously, some photo-resist pillars may collapse before etching; thereby defects are generated.

Thus, it is desirable to pattern STT-MRAM elements into ultra small dimensions having a good uniformity and minimum impact on MTJ magnetic properties by a manufacturing method that realizes high yield, highly-accurate reading, highly-reliable recording and low power consumption while suppressing destruction and reduction of life of MTJ memory device due to recording in a nonvolatile memory that performs recording resistance changes, and maintaining a high thermal factor for a good data retention.

BRIEF SUMMARY OF THE PRESENT INVENTION

The present invention comprises a novel double-photolithographic patterning and etching method to manufacture an ultra small magnetoresistive element for spin-transfer-torque MRAM. The magnetoresistive element in the invention is located at the cross section of two ultra-narrow photo-resist lines suspended between two large photo-resist bases which serve as stabilizing anchors. Array of MRAM cells with small dimensions is finally formed by a third etching process.

In a double photolithography process, a first photo mask pattern is formed on the surface of a magnetoresistive film stack to define a first direction of parallel photo-resist lines with ultra-narrow width having large photo-resist anchoring bases to suspend these thin lines inbetween, followed by forming a second photo mask pattern with 90 degree rotation with respect to the first photo mask to define a second direction of parallel photo-resist lines having large photo-resist anchoring bases to suspend the device's photo-resist lines; accordingly a hard mask array of memory cells with ultra-small dimension is thus formed. A further magnetoresistive element etching process is conducted to form MRAM cell array at the cross section areas.

An exemplary embodiment will be described hereinafter with reference to the companying drawings. The drawings are schematic or conceptual, and the relationships between the thickness and width of portions, the proportional coefficients of sizes among portions, etc., are not necessarily the same as the actual values thereof.

BRIEF DESCRIPTION OF THE DRAWINGS

FIG. 1 is a process flow chart showing MRAM photolithography and etching processes;

FIG. 2 is an exemplary cross-section of a MRAM film stack;

FIG. 3 illustrates a first photo mask to form ultra-narrow photo lines suspended & supported between large photo areas. (a) The supporting photo areas are isolated rectangles, (b) the supporting photo bases are connected large rectangular areas;

FIG. 4 illustrates a second photo mask to form ultra-narrow photo lines with 90 degree rotation with respect to the first photo mask;

FIG. 5($a$) is a schematic top-view of the MRAM hard mask array after the hard mask patterning;

FIG. 5($b$) is a schematic cross-section view of the MRAM film stack including the hard mask;

FIG. 6 is a schematic cross-section view of MRAM cells after patterning all the magnetic layers.

DETAILED DESCRIPTION OF THE INVENTION

Spin transfer torque magnetic random access memory (STT-MRAM) requires small dimensions of magnetoresistive elements to be able to recording, or switch, with a small spin transfer current. Due to the limitation (such as UV light source and photo-resist thickness) of the current photolithography technology, it is extremely difficult to form ultra-small photo-resist pillar mask pattern array with a good straightness and uniformity. If the cell size is getting very small for high capacity applications, the photo-resist pillars will tilt, or bend, or even collapse before etching.

In this invention, we use dual photolithography processes to form hard mask pillar array first before etching and patterning the magnetoresistive stack into final memory element size. A process flow chart of the fabrication is as shown in FIG. 1. First, the full stack of the MRAM film layers is deposited on a substrate (100) in an ultra-high vacuum system. The film stack, as shown in FIG. 2, contains a bottom electrode (110), etching stop layer (120), MRAM core stack (130) having a magnetic reference layer, a tunnel barrier layer, a recording layer and cap layer (130C), and a top hard mask layer (140), wherein the etching stop and hard mask material can be Ta.

Then, the first photo mask (300), as shown in FIG. 3(a), is used to define vertical photo-resist lines having ultra-narrow width. To support the narrow photo-resist lines from collapse, the mask contains large photo-resist anchoring bases to suspend the thin lines in-between. To increase end point detection signal during the second etch (discussed below), these isolated large photo-resist bases (300) can be merged together to increase surface coverage, as shown in FIG. 3(b).

The photo-resist-patterned surface is etched by a reactive ion (RIE) or ion beam (IBE) to remove the top hard mask material. The etch stops at the cap layer (130C) of the MRAM core film stack (130). In a RIE etching process, if Ta is used as the hard mask and bottom etching stop material, the etchant gas can be CF4, CF3OH or other CxFyHx chemical gases. By tuning a CF4 over-etching time, the line width of the hard mask can be further reduced. For an IBE process, the etchant is Ar, Kr or mixture of small amount of $O_2$. Then a photo-resist strip process is conducted in which $O_2$ gas is used to burn away the photo-resist and remove etchant re-deposition.

Further, a second photo mask (400) with 90 deg rotation with respect to the first photo mask, as shown in FIG. 4, is used to form MRAM cells at the cross section area. Again, with the help of the large photo-resist anchoring bases to suspend the device's photo-resist lines, ultra-narrow memory cell lines can be achieved. Following a similar hard mask etching process as described above, a hard mask array of memory cells with ultra-small dimension is thus formed as shown in FIG. 5(a) for top view and FIG. 5(b) for cross section view.

To form the final MRAM memory element cells, a third etching process is used to remove all magnetoresistive layers (130). For a RIE process, a chemical gas of methanol (CH3OH), ethanol (C2H5OH) or mixture of carbon monoxide (CO) & ammonia (NH4) can be used. For an IBE process, Ar or Kr or mixture of Ar and O2 can be used. The etching is stopped at etch stopping layer (120) which is typically Ta for CH3OH RIE process. The cross section view of the final MRAM cells is shown in FIG. 6.

In the MRAM manufactured by the manufacturing method according to this embodiment, the spin transfer switching characteristics of magnetoresistive elements used in memory cells can be improved by fabricating ultra small size of magnetoresistive element array. Accordingly, MRAMs manufactured by the manufacturing method according to this embodiment have high productivity.

The above detailed descriptions are merely illustrative in nature and are not intended to limit the embodiment of the subject matter or the application and uses of such embodiment. Indeed, the novel embodiment described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of manufacturing a magnetoresistive memory element array comprising:
    forming a bottom electrode on a substrate;
    forming an etching stop layer on the bottom electrode;
    forming a magnetoresistive stack film on the etching stop layer;
    forming a cap layer on the magnetoresistive layer;
    forming a hard mask layer on the cap layer;
    forming a first photo-resist pattern to form first parallel photo-resist lines along a first direction and having narrow photo-resist areas with a first width and having anchor-supporting photo-resist areas with a first enlarged width, narrow photo-resist areas and anchor-supporting photo-resist areas are repeated along the first direction;
    conducting a first etching process to etch away exposed top hard mask materials and stop at the cap layer;
    conducting a first photo removal process;
    forming a second photo-resist pattern to form second parallel narrow-width photo-resist lines along a second direction and having narrow photo-resist areas with a second width and having large anchor-supporting photo-resist areas with a second enlarged width, narrow photo-resist areas and anchor-supporting photo-resist areas are repeated along the second direction;
    conducting a second etching process to etch away remaining exposed top hard mask materials and stop at the cap layer;
    conducting a second photo removal process to form a hard mask array;
    forming a magnetoresistive memory element array by conducting a third etch process to etch away exposed magnetoresistive stack layers on exposed areas to top surface or in the middle of the etching stop layer, or top surface or middle of the magnetoresistive stack film.

2. The method of claim 1, wherein said etching stop layer is a single layer of Ta, or Ta alloy, having a thickness in the range of 1 nm and 100 nm.

3. The method of claim 1, wherein said etching stop layer is a multilayer containing at least one Ta sub-layer or Ta-alloy sub-layer, having a thickness in the range between 1 nm and 100 nm.

4. The method of claim 1, wherein said hard mask is a Ta layer.

5. The method of claim 1, wherein said first etching process is an IBE process.

6. The method of claim 1, wherein said first etching process is a RIE etching utilizing a chemical gas CxFy, or CxFyHz, or a mixed gas of CxFy and CxFyHz, preferred to be CF4, or CF3H, or a mixed gas of CF4 and CF3H.

7. The method of claim 1, wherein said first etching process stops at the said cap layer.

8. The method of claim 1, wherein said second etching process is an IBE process.

9. The method of claim 1, wherein said second etching process is a RIE etching utilizing a chemical gas CxFy, or CxFyHz, or a mixed gas of CxFy and CxFyHz, preferred to be CF4, or CF3H, or a mixed gas of CF4 and CF3H.

10. The method of claim 1, wherein said second etching process stops at the said cap layer.

11. The method of claim 1, wherein part of said anchor-supporting photo-resist areas in said first photolithography process is merged to form larger areas to increase end point detection signal during the second etching.

12. The method of claim 1, wherein said third etching process is a RIE etching utilizing a etchant gas methanol (CH3OH), or ethanol, or a mixture of CO & NH4.

13. The method of claim 1, wherein said third etch process stops at said etching stop layer or at magnetoresistive stack film.

14. The method of claim 1, wherein said first direction is perpendicular to said second direction.

15. The method of claim 1, wherein said first enlarged width is at least 5 nm larger than said first width, preferred to be more than 50 nm larger than said first width.

16. The method of claim 1, wherein said second enlarged width is at least 5 nm larger than said second width, preferred to be more than 50 nm larger than said second width.

17. The method of claim 1, wherein said first photo-resist lines and said photo-resist lines overlaid in their narrow width areas to define a magnetoresistive element array.

18. The method of claim 1, wherein said magnetoresistive stack is magnetic tunneling junction stack, or giant magnetoresistive layer, or anisotropic magnetoresistive layer.

19. The method of claim 1, wherein said magnetoresistive stack is replaced by nonmagnetic stack, such as metal layer, or semiconducting layer, or dielectric layer.

* * * * *